United States Patent

Gay

[15] 3,688,220

[45] Aug. 29, 1972

[54] STABLE DIFFERENTIAL RELAXATION OSCILLATOR

[72] Inventor: Michael J. Gay, Scottsdale, Ariz.

[73] Assignee: Motorola, Inc., Franklin Park, Ill.

[22] Filed: June 1, 1971

[21] Appl. No.: 148,827

[52] U.S. Cl. ..................331/111, 307/248, 307/255, 331/108 D, 331/109, 331/176

[51] Int. Cl. ............................................H03k 3/282

[58] Field of Search..331/108 D, 109, 111, 175, 176; 307/248, 255

[56] References Cited

UNITED STATES PATENTS 3,351,776 11/1967 Chin......................331/111 X 3,581,120 5/1971 Nord......................307/255 X

*Primary Examiner*—Roy Lake
*Assistant Examiner*—Siegfried H. Grimm
*Attorney*—Mueller & Aichele

[57] ABSTRACT

A monolithic, integrated, voltage and temperature stable, relaxation oscillator uses a parallel resistive-capacitive timing network to cause a change of state of a differential switching circuit when the charge on the capacitor equals a reference potential applied to the differential switching circuit. A switching transistor in the capacitor charging path then is rendered conductive by a drive circuit controlled by the differential switching circuit. The drive circuit is supplied from a higher B+ potential than that applied to the collector of the switching transistor to minimize the effect of temperature caused variations in the base-emitter voltage characteristics of the switching transistor on the circuit.

13 Claims, 3 Drawing Figures

Inventor
MICHAEL J. GAY
BY
Mueller & Aichele
ATTYS.

STABLE DIFFERENTIAL RELAXATION OSCILLATOR

BACKGROUND OF THE INVENTION

Many applications exist for relaxation oscillators forming timing circuits in data transmission systems, sweep oscillators in television receivers, and reference oscillators in inductorless decoders for stereophonic FM radio receivers, and the like. Relaxation oscillators are found in many different forms but generally are quite sensitive to supply voltage variations and temperature variations which cause shifts in the frequency of operation of the oscillators, so that they generally are not capable of maintaining a precise frequency of operation.

Thus, it is desirable to provide a relaxation oscillator which is not subject to such variations in operating frequency due to supply voltage variations and ambient temperature changes. In addition, it is desirable to fabricate a relaxation oscillator in integrated circuit form, such as a monolithic integrated circuit, so that the inherent advantages of integrated circuits may be realized. The base-emitter junctions of transistors in monolithic integrated circuits, however, are subject to variations in their operating parameters or characteristics with changes in ambient temperature. Thus, monolithic integrated circuits tend to be temperature sensitive; so that temperature compensation for the base-emitter junction variations of the transistors appearing in the circuit is necessary to prevent the variations from affecting the operating characteristics of the circuit.

SUMMARY OF THE INVENTION

Accordingly, it is an object of this invention to provide an improved oscillator circuit.

It is another object of this invention to provide an improved differential relaxation oscillator circuit, the operating characteristics of which are substantially independent of variations in ambient temperature.

It is an additional object of this invention to provide a monolithic integrated relaxation oscillator, the operation of which is substantially independent of variations in ambient temperature.

It is a further object of this invention to restore the charge on the timing capacitor of a relaxation oscillator through a first transistor switch by driving the first transistor switch with another transistor switch coupled to a supply potential which is higher than the supply potential for the first transistor switch in an amount sufficient to eliminate dependence of the circuit on the characteristics of the base-emitter junction of the first transistor switch.

In accordance with a preferred embodiment of this invention, a parallel RC timing circuit is connected between a point of reference potential and the base of one of a pair of transistors connected in a differential switching circuit. The other transistor is supplied with a reference voltage which establishes a switching level for the differential switch. The timing capacitor is recharged to an initial value through a transistor switch, the collector-emitter path of which is connected in series between the junction of the timing circuit with the base of the first differential amplifier switch and a first supply voltage. The conductivity of this latter transistor switch in turn is controlled by connecting its base in series with the collector-emitter path of a further control transistor, supplied from a second supply voltage which is higher than the first supply voltage at least by an amount equal to the voltage drop of the collector-emitter junction of the further transistor and the base-emitter drop (1 Φ) of the transistor switch.

The differential switch controls the conductivity of the further control transistor; and when the control transistor is rendered conductive, the transistor switch in turn is rendered conductive and driven into full saturation. The potential appearing on the emitter of the transistor switch is substantially equal to the value of the first supply voltage since the base thereof is driven by a potential which is substantially 1 Φ above the first supply voltage. Thus, variations in the characteristics of the base-emitter junction of the charge control transistor with temperature are eliminated, causing the circuit operation to be independent of such temperature caused variations.

DETAILED DESCRIPTION

Figure 1:
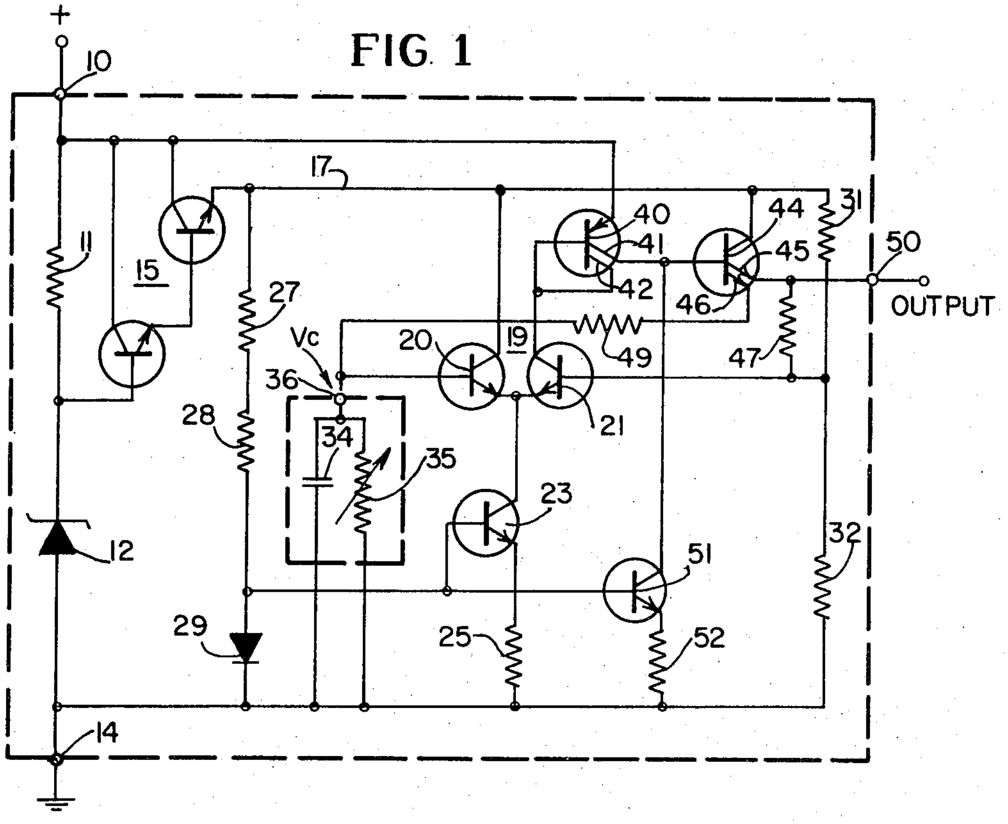
FIG. 1 is a detailed schematic diagram of a preferred embodiment of the invention.

Referring now to the drawing, FIG. 1 is directed to a relaxation oscillator circuit in accordance with a preferred embodiment of the invention which is suitable for fabrication in integrated circuit form, preferably monolithic integrated circuit form. In FIG. 1 the components which are formed as part of the monolithic integrated circuit are enclosed within the dotted lines.

To provide the DC operating potentials or voltages for the relaxation oscillator circuit, a primary source of B+ operating potential (not shown) having a value V2 is coupled to a bonding pad 10 on the integrated circuit. To obtain a stabilized potential from this primary source, a voltage divider in the form of a resistor 11 and a zener diode 12 is connected in series between the bonding pad 10 and a bonding pad 14, which is connected to ground. The potential appearing across the zener diode 12 is relatively constant with variations in the supply voltage applied to the bonding pad 10, and the junction between the resistor 11 and zener diode 12 is coupled to the base of an NPN Darlington emitter-follower circuit 15, which then supplies a stabilized operating potential V1 on a lead 17. The potential V1 constitutes the primary operating potential for the circuit.

The primary switching circuit used in the oscillator is a differential switch 19 including a pair of NPN transistors 20 and 21. Operating current for the differential switch 19 is provided by an NPN current source transistor 23, the collector of which is connected to the emitters of the transistors 20 and 21, and the emitter of which is connected through an emitter resistor 25 to the grounded bonding pad 14. The base of the current source transistor 23 is supplied with a bias potential developed across a diode 29 in a voltage divider, consisting of a pair of resistors 27 and 28 and the diode 29, connected in series between the lead 17 and the grounded bonding pad 14. The junction between the anode of the diode 29 and the resistor 28 is connected to the base of the transistor 23 and the diode 29 also provides temperature compensation for the base-emitter junction of the transistor 23 in a well known manner.

The lower threshold or switching point of the differential switch 19 is established by a pair of voltage divider resistors 31 and 32, which are connected in series between the lead 17 and the grounded bonding pad 14, by connecting the junction between the resistors 31 and 32 to the base of the transistor 21. The potential applied to the base of the transistor 20 of the switch 19 is obtained from a parallel RC timing network including a timing capacitor 34 and a discharge resistor 35 connected between a bonding pad 36, coupled to the base of the transistor 20, and ground. The capacitor 34 and resistor 35 are located externally of the integrated circuit chip and are selected to be highly temperature stable components.

If it is desired to vary the frequency of operation of the oscillator, the resistor 35 may be made as a variable resistor as indicated in the drawing. This, however, is not necessary if a fixed frequency of operation of the oscillator is desired. Then the resistor 35 may have a fixed value.

Figure 2:
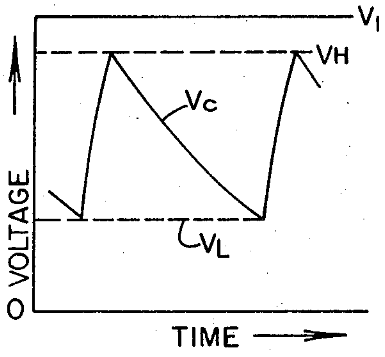
FIGS. 2 and 3 are waveforms which appear at different points in the circuit of FIG. 1.

Assume that the capacitor 34 is charged to some value and is discharging to ground through the resistor 35. In this condition of operation, the voltage VC on the bonding pad 36 is at some intermediate point between the voltage values VH and VL on the falling ramp of voltage indicated in FIG. 2. The voltage VL shown in FIG. 2 is the lower threshold voltage which is applied to the base of the transistor 21 from the voltage divider 31, 32. With the voltage VC at this intermediate value, the voltage on the base of the transistor 20 is greater than the reference voltage applied to the base of the transistor 21. This causes the transistor 20 to be rendered conductive and the transistor 21 is nonconductive, and the circuit remains in this state until the voltage VC drops to near the value of the voltage VL applied to the base of the transistor 21. When this condition of operation is reached, the transistor 21 commences conduction.

A positive feedback switching circuit including a dual-collector lateral PNP transistor 40 and a dual-emitter NPN transistor 44 is interconnected in the circuit in a positive feedback loop with the transistors 20 and 21. Specifically, the collector of the transistor 21 is connected to the base of the transistor 40, and one of the collectors 42 of the transistor 40 also is coupled to its base to form a diode connected between the collector of the transistor 21 and the B+ bonding pad 10. The current drawn by the collector of the transistor 21 renders the lateral PNP transistor 40 conductive, and the collector 41 of the transistor 40 is connected to the base of the lateral NPN transistor 44 to drive the transistor 44 into conduction.

The collector of the transistor 44 is connected to the lead 17, on which the voltage V1 appears, and the relationship between the voltages V1 and V2 is selected to cause the voltage V2 to be higher than the voltage V1 at least by an amount equal to the voltage drop of the collector-emitter path of the transistor 40 when saturated and the base-emitter drop (1 Φ) of the transistor 44 less the voltage drop of the collector-emitter path of the transistor 44 when saturated. As a consequence, the transistor 44 is driven into saturation, and the potential appearing on the emitters 45 and 46 is substantially equal to the voltage V1; so that any variations in the operating characteristics of the base-emitter junction of the transistor 44 are eliminated from the circuit.

Figure 3:
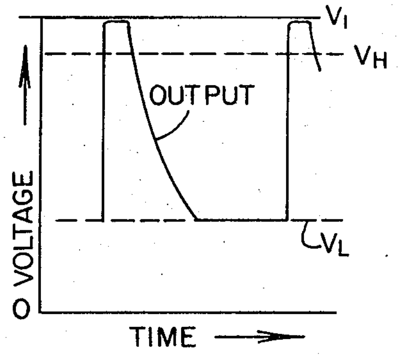

When the transistor 44 is rendered conductive, a resistor 47 is connected in parallel with the resistor 31 through the collector-emitter 45 junction of the transistor 44. The value of the resistor 47 is substantially lower than the value of the resistor 31; so that when the transistor 44 is rendered conductive, the bias potential applied to the base of the transistor 21 is substantially increased causing the transistor 21 to rapidly be driven to full conduction and to cause the transistor 20 to be cut off. The potential on the base of the transistor 21 with the transistor 44 conductive then rises to a value VH as shown in FIGS. 2 and 3.

At the same time, the emitter 46 of the transistor 44 also has a potential substantially equal to V1 appearing thereon, and this potential is coupled through a relatively low value resistor 49 to the bonding pad 36 to rapidly charge the capacitor 34 toward the voltage V1. Thus, the voltage VC rises from a value near VL in the manner shown in the rising portion of the curve shown in FIG. 2.

When the voltage VC appearing on the bonding pad 36 reaches the value VH, the transistor 20 once again commences conduction, and the transistor 21 is rendered less conductive. This in turn causes the conductivity of the transistors 40 and 44 to be reduced. The reduction in conductivity of the transistor 44 causes the potential applied through the resistor 47 to the base of the transistor 21 to be reduced, which in turn results in a regenerative positive feedback action rapidly causing the transistor 20 to be rendered fully conductive and the transistor 21 to be rendered nonconductive. The sequence of operation then is repeated, with the capacitor 34 discharging through the resistor 35 toward the value VL which now has been reestablished on the base of the transistor 21 as the reference potential by the voltage divider 31, 32 since the resistor 47 is connected to an open circuit in the form of the nonconductive transistor 44.

By using differentially-connected transistors 20 and 21 in the switch 19, the base-emitter junctions of the transistors 20 and 21 have characteristics which track with temperature; so that the switching characteristics of the switch 19 are temperature compensated by virtue of the matched differential transistors 20 and 21. Connection of the emitter of the transistor 40 to the supply voltage V2 and connection of the collector of the transistor 44 to the supply voltage V1 prevents variations with temperature of the base-emitter junction characteristics of the transistor 44 from affecting the operation of the circuit. Since the capacitor discharge time through the resistor 35 is selected to be much longer than the charge time through the resistor R3, the value of resistance of the resistor R3 is small compared with the value of resistance of the resistor 35. As a consequence, the oscillator frequency is effectively determined by the capacitor 34 and the resistor 35, which are selected as external high stability components, without the incurrence of excessive temperature dependence caused by the value of the internal resistor 49. If a large resistor were used for the resistor 49, changes in the resistance of the resistor 49 with changes in ambient temperature could be a significant factor in the frequency of operation of the circuit and some type of compensation then would have to be provided.

The upper and lower switching thresholds VH and VL, respectively, both are defined by resistor ratios determined by the values of the resistors 31, 32 and 47, and these thresholds are fixed fractions of the supply voltage V1. As a consequence, the frequency of operation of the oscillator is substantially independent of the supply voltage appearing on the lead 17; so that even if this voltage were subject to variation, the output frequency of the oscillator appearing on the emitter of the transistor 45 would be substantially constant. The output waveform appearing at this point in the circuit on an output bonding pad 50 is shown in FIG. 3.

The diode formed by the collector 42 of the transistor 40 interconnected with the base of that transistor operates to establish a defined current gain for the circuit which permits a relatively stable determination of the frequency characteristics of the oscillator. If these desirable characteristics provided by this diode are not desired in the circuit, the diode may be eliminated from the circuit. By the use of a dual-collector lateral PNP transistor, however, such a diode can be obtained readily. In addition, by employing a dual-collector lateral PNP transistor for the transistor 40, with the two collectors 41 and 42 connected as shown in FIG. 1, and with the collector 41 being such as to conduct a larger current than the collector 42, increased drive to the base of the transistor 44 is possible, while simultaneously maintaining the adequate frequency response of the circuit through the transistor 40. This technique (collector 41 larger than collector 42) permits the currents in the input transistors 20 and 21 to be less than would be required were the two collectors 41 and 42 equal or if the transistor 40 were replaced by a single collector transistor with a separate but matched diode connected across its base-emitter junction to define a unity current gain.

An additional current source transistor 51 is provided with its collector connected to the junction of the collector 41 of the transistor 40 with the base of the transistor 44 and with its emitter connected through an emitter resistor 52 to the grounded bonding pad 14. The base bias potential for the transistor 51 is obtained from the junction of the diode 29 with the resistor 28, and the transistor 51 provides a pull-off current at the base of the transistor 44.

The chart below provides a list of component values used in a circuit which has been successfully operated:

| COMPONENTS | VALUES |
|---|---|
| Capacitor 34 | 680 pf |
| Resistor 25 | 500 ohms |
| Resistor 31 | 6 kilohms |
| Resistor 32 | 2 kilohms |
| Resistor 35 | 15 kilohms |
| Resistor 47 | 250 ohms |
| Resistor 49 | 500 ohms |
| Resistor 52 | 4.5 kilohms |

The values of the components in the above chart are given solely for purposes of illustration and are not to be considered as the only values which can be used for these components.

What is claimed is:

1. An oscillator circuit including in combination:

first, second and third voltage supply terminals;

means for connecting a first DC supply across said first and third supply terminals;

means for connecting a second DC supply across said second and third voltage supply terminals;

means for providing a reference voltage;

first and second semiconductor switching devices, each having first, second, and control electrodes, with the second electrodes thereof interconnected in circuit with said third voltage supply terminal and the first electrode of said first semiconductor switching device being connected with one of said first and second voltage supply terminals;

means for coupling said reference voltage to the control electrode of one of said first and second semiconductor switching devices;

third and fourth semiconductor devices having first and second states of conduction and each having at least first, second, and control electrodes, one of the first and second electrodes of said third semiconductor switching device being coupled with said second voltage supply terminal, the other of the first and second electrodes of said third semiconductor switching device being coupled with the control electrode of said fourth semiconductor device, one of the first and second electrodes of said fourth semiconductor switching device being coupled with said first voltage supply terminal;

means for coupling the control electrode of said third semiconductor switching device with the first electrode of said second semiconductor switching device;

a timing network coupled with said third supply terminal and the control electrode of the other of said first and second semiconductor switching devices for providing a time varying control voltage, the conduction of said first and second semiconductor switching devices changing when said time varying control voltage substantially equals said reference voltage to cause said third and fourth semiconductor switching devices to switch from said first state of conduction to said second state of conduction; and means for coupling the other of the first and second electrodes of said fourth semiconductor switching device with said timing network for resetting said timing network to an initial value in response to the switching of states of conduction of said fourth semiconductor switching device.

2. The combination according to claim 1 wherein said first DC supply has a first predetermined magnitude and said second DC supply has a second predetermined magnitude greater than said first predetermined magnitude.

3. The combination according to claim 2 wherein said means for providing a reference voltage includes at least first and second resistance means connected together at a junction and connected in series in the order named between said third voltage supply terminal and one of said first and second voltage supply terminals, said junction being coupled with the control electrode of said one of said first and second semiconductor switching devices, and the combination further including third resistance means coupled between said junction and said other of the first and second electrodes of said fourth semiconductor switching device.

4. The combination according to claim 3 wherein the magnitude of said third resistance means is substantially less than the magnitude of said second resistance means.

5. An oscillator circuit including in combination:

first, second and third voltage supply terminals;

means for coupling said third voltage supply terminal to a point of reference potential;

means for coupling a first predetermined DC supply voltage with said first voltage supply terminal;

means for coupling a second predetermined DC supply voltage with said second voltage supply terminal, said second predetermined supply voltage being greater in magnitude than said first predetermined DC supply voltage;

first and second resistance means connected together at a first junction and coupled in series, in the order named, between said third voltage supply terminal and one of said first and second voltage supply terminals;

first and second transistors, each having collector, emitter, and base electrodes, with the emitters thereof coupled together in circuit with said third voltage supply terminal, the collector of said first transistor being coupled with said first voltage supply terminal and the base of said second transistor being connected with said first junction;

third and fourth transistors, each having at least collector, emitter, and base electrodes, with the collector-emitter path of said third transistor being connected between said second voltage supply terminal and the base of said fourth transistor, the collector of said second transistor being coupled with the base of said third transistor, and the collector of said fourth transistor being coupled with said first voltage supply terminal;

third resistance means coupled between the emitter of said fourth transistor and said first junction;

a timing network coupled between said third voltage supply terminal and a second junction coupled with the base of said first transistor for providing a time varying control voltage; and means coupling the emitter of said fourth transistor with said second junction.

6. The combination according to claim 5 wherein said first, second and fourth transistors are of one conductivity type and said third transistor is of an opposite conductivity type and said timing network includes a timing capacitor coupled in parallel with a fourth resistance means between said third voltage supply terminal and said second junction.

7. The combination according to claim 6 wherein said third voltage supply terminal is coupled with a point of reference potential and said fourth transistor is a dual-emitter transistor having first and second emitters, with the first emitter thereof being coupled through said third resistance means to said first junction and the second emitter thereof being coupled with said second junction.

8. The combination according to claim 7 wherein said first, second and fourth transistors are NPN transistors and said third transistor is a PNP transistor and the potentials applied to said first and second voltage supply terminals comprise first and second positive potentials, respectively, with said second potential being greater than said first potential by an amount at least equal to the voltage drop across the emitter-collector junction of said third transistor when saturated and the base-emitter junction of said fourth transistor less the voltage drop across the collector-emitter junction of said fourth transistor when saturated.

9. The combination according to claim 8 further including fifth resistance means coupling the second emitter of said fourth transistor with said second junction, wherein the magnitude of resistance of said fifth resistance means is substantially less than the magnitude of resistance of said fourth resistance means, and the magnitude of resistance of said third resistance means is substantially less than the magnitude of resistance of said second resistance means.

10. The combination according to claim 9 wherein at least said first, second, third and fourth transistors and said first, second, third, and fifth resistance means all form part of an integrated circuit, and said third transistor is a dual-collector lateral PNP transistor having first and second collectors, with the first collector thereof being connected with the base of said fourth transistor and the second collector thereof being coupled in common with the base of said third transistor and the collector of said second transistor.

11. In a semiconductor device, a circuit for minimizing temperature caused operating variations including in combination:

first, second and third voltage supply terminals;

means for coupling said third voltage supply terminal to a point of reference potential;

means for coupling a first predetermined DC supply voltage with said first voltage supply terminal;

means for coupling a second predetermined DC supply voltage with said second voltage supply terminal, said second predetermined supply voltage being greater in magnitude than said first predetermined DC supply voltage;

a switching circuit including first and second transistors, each having at least collector, base and emitter electrodes, with the collector-emitter path of said first transistor being connected between said second voltage supply terminal and the base of said second transistor, and the collector of said second transistor being coupled with said first voltage supply terminal;

means for coupling a load between the emitter of said second transistor and said third voltage supply terminal; and means for applying a varying potential to the base of said first transistor to render said first transistor conductive and nonconductive in accordance therewith.

12. The combination according to claim 11 wherein said first transistor is a PNP transistor, said second transistor is an NPN transistor, and the magnitude of said second predetermined supply voltage is greater than the magnitude of said first predetermined supply voltage by an amount at least equal to the voltage drop across the collector-emitter junction of said first transistor, when said first transistor is saturated, and the base-emitter junction of said second transistor less the voltage drop across the collector-emitter junction of said second transistor when saturated.

13. The combination according to claim 12 wherein said semiconductor device comprises a monolithic integrated circuit, said first transistor is a lateral PNP transistor and said second transistor is an NPN transistor.

* * * * *